United States Patent [19]

McCollough

[11] 4,105,325
[45] Aug. 8, 1978

[54] MICROPLATE SYSTEM

[76] Inventor: John D. McCollough, 10715 Rochester Ave., Los Angeles, Calif. 90024

[21] Appl. No.: 798,123

[22] Filed: May 18, 1977

[51] Int. Cl.² ............................................. G03B 27/44
[52] U.S. Cl. .......................................... 355/54; 354/4; 354/124; 355/72
[58] Field of Search ...................... 355/53, 54, 72, 74; 354/4, 18, 19, 123, 124

[56] References Cited

U.S. PATENT DOCUMENTS

| 1,499,267 | 6/1924 | Vindemore | 354/124 |
| 3,449,049 | 6/1969 | Harding et al. | 355/53 |
| 3,639,056 | 2/1972 | Gerson | 355/53 X |
| 3,674,367 | 7/1972 | Chapman | 355/53 X |
| 3,837,742 | 9/1974 | Wally, Jr. | 355/54 |
| 3,972,610 | 8/1976 | Gross | 355/54 |
| 3,998,546 | 12/1976 | Wally, Jr. et al. | 355/54 X |

Primary Examiner—Richard A. Wintercorn
Attorney, Agent, or Firm—Fulwider, Patton, Rieber, Lee & Utecht

[57] ABSTRACT

An apparatus for use in making printing plates in which a sheet of photo-sensitive material is held by a hanger and moved horizontally and vertically. Successive areas are, in this manner, aligned with a projector and exposed to separate images, each image corresponding to one page of a book. Telescoping cylinders produce the desired movement of the sheet in discrete steps so the position of the sheet need not be manually adjusted for each image. In an embodiment that uses aperture cards containing micrographic images, the card holding portion of the projector is rotatable to invert the images as required.

15 Claims, 13 Drawing Figures

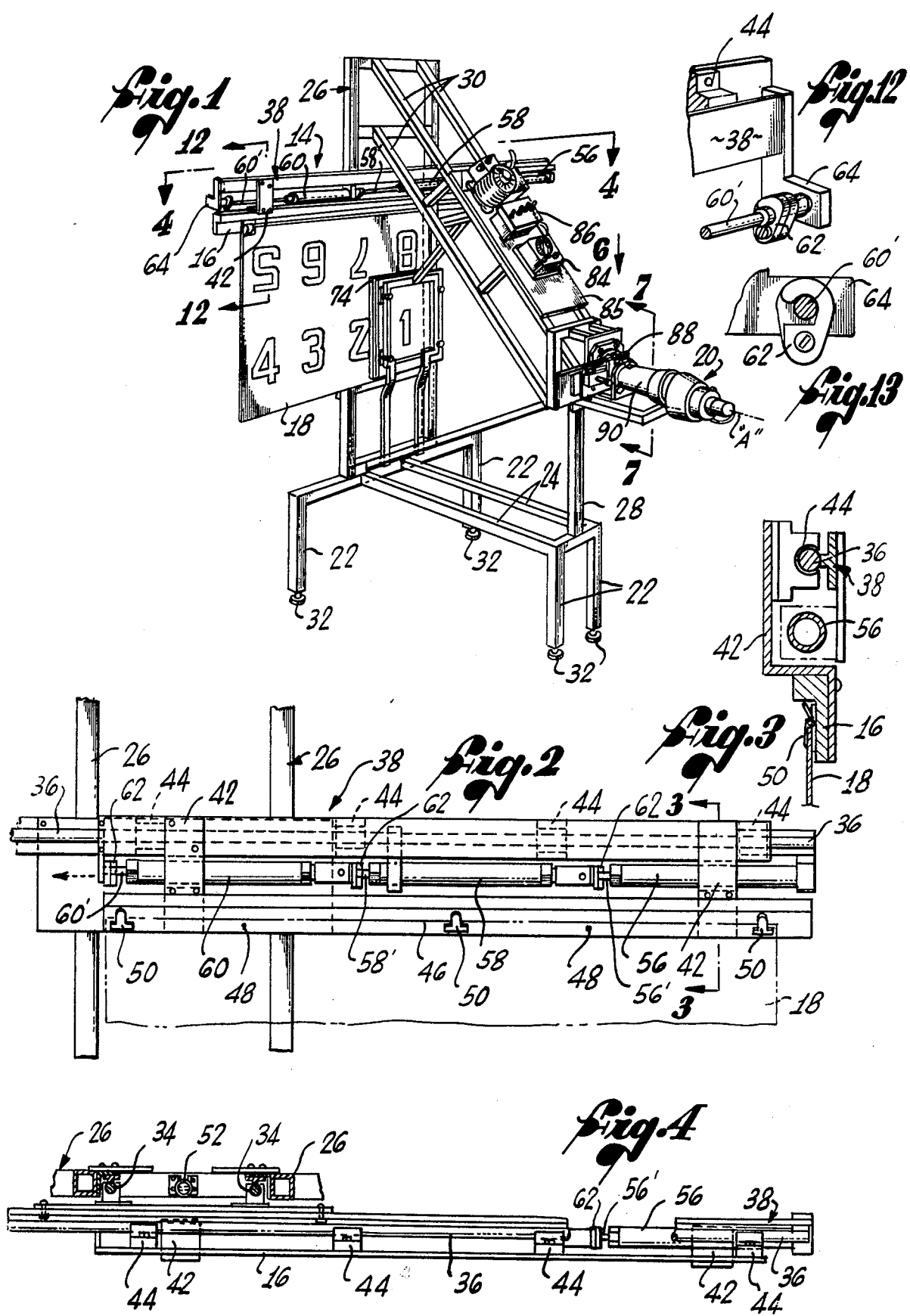

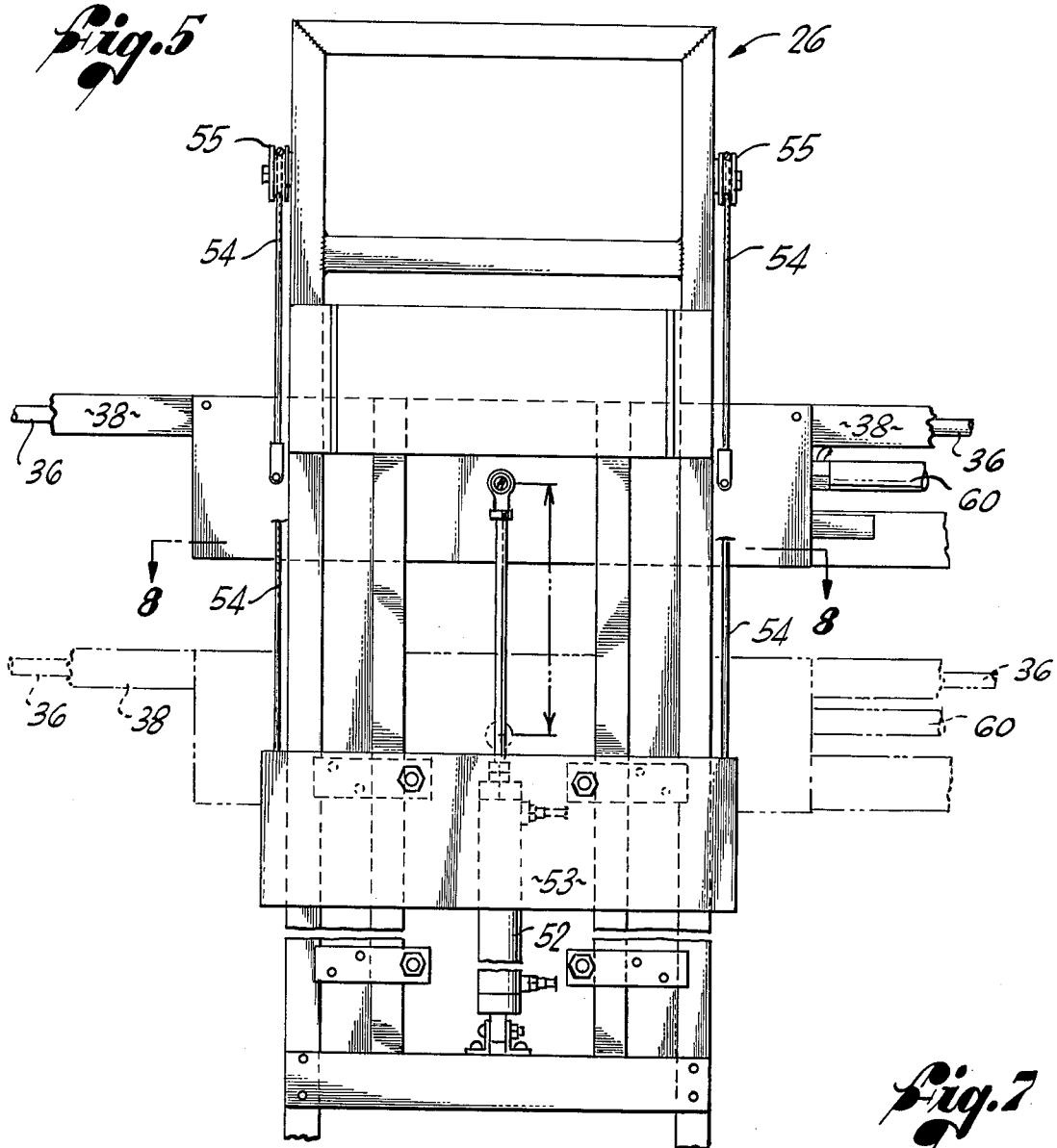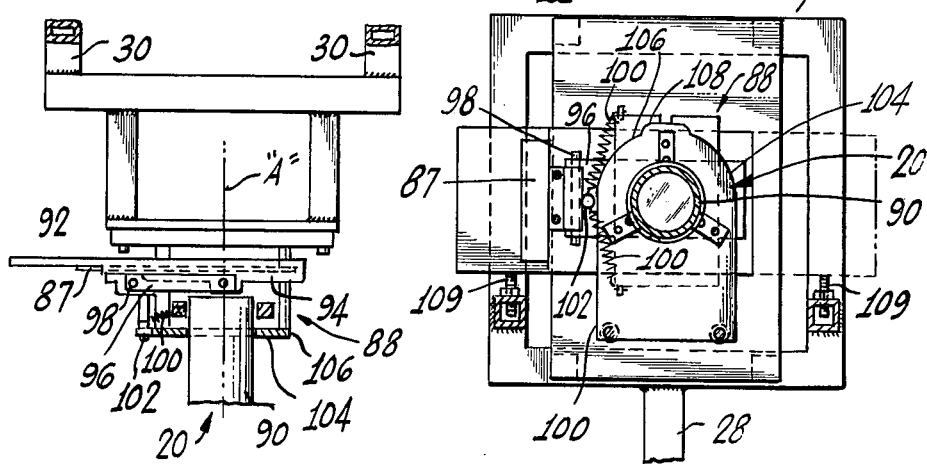

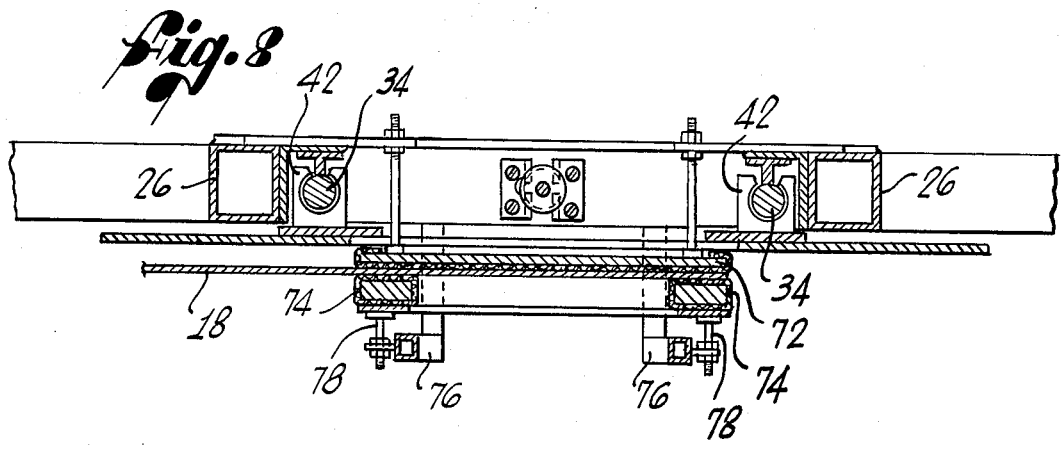
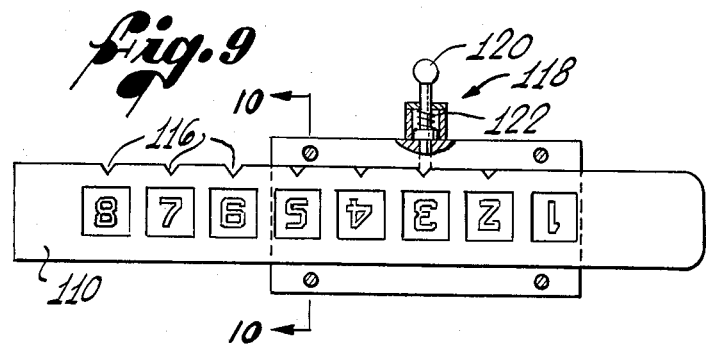
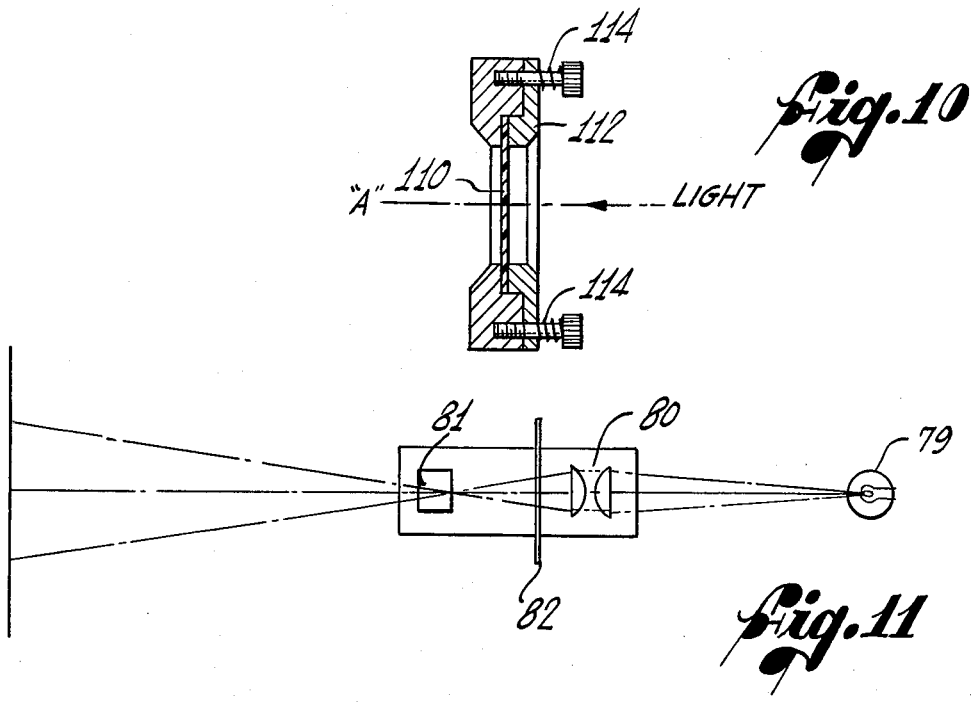

MICROPLATE SYSTEM

BACKGROUND OF THE INVENTION

The present invention relates to the manufacture of books, and more particularly to an apparatus for the production of printing plates in signature format.

According to the conventional method for the manufacture of books, when the content which is available in the form of photographic transparencies, groups of negatives, each representing one page, are stripped together into large composite negatives known as flats. Most frequently, a single flat includes eight pages arranged in two parallel rows of four, one row being inverted with respect to the other. The flats are used to make plates each of which is capable of printing a single sheet known as a signature. After folding so that the pages of a signature are in sequential order and properly oriented, the pages are bound by gluing or sewing.

Recent advances in printing technology permit the manufacture of photo-direct plates which can be directly exposed to a projected image, bypassing the previously required negative to plate contact print, and the step of stripping together the separate negatives, which is a time-consuming and costly part of the process.

SUMMARY OF THE INVENTION

The present invention provides an apparatus for making printing plates that eliminates the need for stripping together page negatives into flats, thereby substantially reducing labor and material costs. The apparatus includes a support on which a track mechanism is mounted, and a hanger for a vertical sheet of photo-sensitive material that is movable both horizontally and vertically on the track. Pre-recorded micrographic images corresponding to individual pages of a signature are enlarged and projected from transparencies onto successive exposure areas of the photo-sensitive sheet. The exposure areas may be defined by a frame biased toward a back-up plate so that the sheet is held flat between the frame and the plate during the exposure.

Eight separate areas of the sheet are exposed sequentially by moving the hanger on the tracks, each movement encompassing a discrete predetermined step. In a preferred embodiment, the hanger and horizontal track move vertically on a pair of vertical tracks, and the hanger is movable along the horizontal track. A transport mechanism that moves the hanger in a step-like manner includes three fluid-actuated telescoping cylinders connected end to end for horizontal movement. A single cylinder can produce the desired vertical movement.

A projector that forms the images on the sheet includes a light source, a condenser lens, an image forming lens, and a mechanism for holding aperture cards or film strips bearing the pre-recorded images. An aperture card arrangement utilizes a rotatable card holder which permits the cards to be selectively inverted in accordance with the desired signature format. A cam mechanism can be provided that is responsive to rotation of the holder to position the cards securely in either of the two ready positions, but releases the cards for removal as they pass through an intermediate position.

The aperture card technique is particularly advantageous in connection with the production of such books as parts and repair manuals that are updated periodically. Additional or substitute cards can be inserted in the deck with a minimum of effort. The cards are also a convenient medium where various pages or groups of pages are common to a series of publications that may, for example, be directed to the maintenance of a series of related machines.

To vary the positions of the projected images, thereby accommodating either perfect or saddle stitch binding, a plurality of removable spacers may be attached to the cylinders of a transport mechanism to restrict the cylinder strokes. Apart from this adjustment for the particular type of binding to be used, the positioning of the images on the sheet is largely automatic and does not require individual adjustment. The exposures can be made in rapid succession, effecting a substantial savings in comparison to conventional labor intensive techniques.

Other features and advantages of the present invention will become apparent from the following detailed description taken in conjunction with the accompanying drawings which illustrate, by way of example, the principles of the invention.

BRIEF DESCRIPTION OF THE DRAWINGS

FIG. 1 is a perspective view of an exemplary apparatus for making printing plates embodying many novel features of the present invention, the cylinders of the apparatus being shown in the extended position;

FIG. 2 is an enlarged, fragmentary, plane view of the apparatus of FIG. 1 showing the air cylinders of the horizontal transport mechanism in the retracted position;

FIG. 3 is an enlarged cross-sectional view of the apparatus taken along the line 3—3 of FIG. 1;

FIG. 4 is an enlarged, fragmentary, cross-sectional view of the apparatus taken along the line 4—4 of FIG. 1;

FIG. 5 is an enlarged, fragmentary, plane view of the mast of the apparatus;

FIG. 6 is an enlarged, fragmentary, plane view of a portion of the projector of the apparatus taken in the direction of the arrow 6 of FIG. 1;

FIG. 7 is an enlarged, fragmentary, cross-sectional view of the apparatus taken along the line 7—7 of FIG. 1;

FIG. 8 is an enlarged, fragmentary, cross-sectional view taken along the line 8—8 of FIG. 5;

FIG. 9 is a plane view of a film strip indexing mechanism constructed in accordance with a modification of the apparatus of FIG. 1;

FIG. 10 is a cross-sectional view of the indexing mechanism taken along the line 10—10 of FIG. 9;

FIG. 11 is a schematic diagram of the projector of the apparatus of FIG. 1;

FIG. 12 is an enlarged, fragmentary, perspective view of one end of the hanger and horizontal transport mechanism of the apparatus modified by the addition of a spacer; and FIG. 13 is an enlarged, cross-sectional view of the fragmentary portion shown in FIG. 12.

DESCRIPTION OF THE PREFERRED EMBODIMENT

An exemplary apparatus 10 embodying many novel features of the present invention and useful for making printing plates is depicted in FIGS. 1 through 8. It includes an open steel framework that forms a support 12, a track mechanism 14 attached to the support, a hanger 16 for a photo-sensitive sheet 18 movable on the track mechanism, and a projector 20 mounted on the support and aligned with the photo-sensitive sheet.

As shown in FIG. 1, the support 12 includes four short vertical legs 22, a plurality of horizontal members 24 connecting the legs, a vertical mast 26 at one end, and a shorter vertical post 28 at the opposite end. Four parallel braces 30 are inclined upwardly from the top of the post 28 to the top of the mast 26. The legs 22 are provided with individually adjustable feet 32 to eliminate any rocking movement.

The track mechanism 14 includes a pair of vertical tracks 34 that extend along the mast 26 (FIGS. 4 and 8) and a horizontal track 36 (FIG. 3) that rides up and down on the vertical tracks, each of the tracks taking the form of a cylindrical rod. The horizontal track 36, with its supporting structure 38, engages the vertical tracks 34 by a plurality of ball bushings 40. Horizontal movement of the hanger 16 and sheet 18 is produced by sliding them along the horizontal track 36 from which the hanger is hung by brackets 42 and ball bushings 44. Vertical movement of the hanger 16 and the sheet 18 is accomplished by raising or lowering the horizontal track 36 on the vertical tracks 34.

The photo-sensitive sheet 18 is suspended vertically from the hanger 16, hung along its top edge 46 where it is positioned by pins 48 received in pre-punched, accurately positioned holes. Spring clips 50 near the corners and in the center of the sheet 18 prevent it from disengaging the pins 48. Preferably, the sheet 18 is of a photo-direct material which itself forms the printing plate after exposure to images. This photo-direct process eliminates the need for exposing the plate to a film negative as a separate processing step, and a variety of photo-direct materials are well known and commercially available.

A pneumatic transport mechanism propels the hanger 16 and sheet 18 both vertically and horizontally along the track mechanism 14 in discrete steps of predetermined length. In this way, it positions successive exposure areas of the sheet 18 before the projector 20.

The component of the transport mechanism that produces vertical motion is a single, vertically oriented, telescoping, air cylinder 52. Controlled by electromagnetic valves (not shown), the vertical cylinder 52 assumes one of two positions, fully extended or fully retracted. With the vertical cylinder 52 extended, as shown in FIGS. 1 and 5, a bottom row of four exposure areas 1 through 4 on the sheet 18 can be aligned with the projector 20. When the vertical cylinder 52 is retracted, the sheet 18 moves downwardly, to the position shown in phantom lines in FIG. 5, for exposure of a parallel top row of four exposure areas 5 through 8.

So that the vertical cylinder 52 need not act against the entire weight of the sheet 18, hanger 16, horizontal track 36, and supporting structure 38 when raising or holding the sheet to expose the bottom row of images, a counterweight 53 is provided on the back side of the mast 26. Cables 54 that extend over pulleys 55 on the sides of the masts 26 connect the counterweight 53 to the horizontal track supporting structure 38.

Horizontal movement of the hanger 16 and the photo-sensitive sheet 18 is produced by three similar telescoping fluid-actuated cylinders 56, 58 and 60 connected end to end. With all of the horizontal cylinders 56, 58 and 60 fully extended, the hanger 16 and sheet 18 are moved to the extreme left-hand side, as shown in FIG. 1, to align the projector 20 with either of the exposure areas No. 1 or 8 on the right-hand side of the sheet 18. If one of the horizontal cylinders 56, 58 or 60 is retracted, the sheet 18 and hanger 16 move one discrete horizontal step to the right along the horizontal track 36 to align either of the areas 2 or 7. Upon the successive retraction of the next two horizontal cylinders, the remaining exposure areas 3 and 6, and 4 and 5 are brought before the projector 20. The operator of the apparatus 10 thus can bring the exposure areas 1 through 8 into proper alignment in the desired sequence.

Since the stroke of the air cylinders 52, 56, 58 and 60 automatically produces the proper length of movement, the operator need not take time to adjust the position of the sheet 18 for each exposure and the steps of exposing the successive areas 1 through 8 can take place in rapid succession. The entire sheet 18 can be exposed quickly and efficiently in sharp contrast to the time-consuming and painstaking process of stripping page negatives and contact printing.

It is desirable that the horizontal movement of the sheet 18 be adjustable to accommodate either perfect binding or saddle stitching of the folded signatures, although the adjustment should be made only once at the beginning of a series of exposures and should not require further attention from the operator. This adjustment can be effected simply by a spacer 62 placed over the rod 60 of each horizontal cylinder and against an end piece 64 to which the rod is attached, as shown in FIGS. 12 and 13. Once in place, it restricts the stroke of the corresponding cylinder to adjust the positions of the exposure areas on the sheet. The spacer 62 is slotted so that it is easily removable from the rod 60.

The individual exposure area of the sheet 18 positioned before the projector 20 hangs in front of a velvet covered vertical backing plate 72 which is attached to the mast 26 and perpendicular to the lens axis "A" of the projector 20, as shown in FIG. 8. The sheet 18 is held flat against the backing plate 72 by a rectangular frame 74, also velvet covered. It slides easily between the velvet surfaces, but is nevertheless held flat within the focal plane of the projector 20 to avoid distortion.

A pair of brackets 76 that extend upwardly from one of the horizontal mounting members 24 supports the frame 74. The correct spacing between the plate 72 and the frame 74 is achieved by threaded frame positioning members 78 that connect the brackets 76 to the frame.

The projector 20 of the apparatus 10, shown schematically in FIG. 11, includes a light source 79, a pair of plano-convex lens elements that form condensing lens 80 and an image forming lens 81. A micrographic transparency 82 containing the image to be reproduced on the sheet 18 is held in a ready position between the condensing lens 80 and the image forming lens 81. The intensity of the light source 78 is controlled by a Variac 83 and the duration of its illumination for a single exposure is controlled by a timer 84. Both the Variac 83 and the timer 84 are mounted on a control panel 85 that is supported in a readily accessible position by the braces 30, as shown in FIG. 1. A gang of toggle switches 86 that control the cylinders 52, 56, 58 and 60 is also mounted on the panel 85.

In the embodiment of the invention shown in FIG. 1, the projector 20 is adapted for use with transparencies 87 in the form of aperture cards, the micrographic image pre-recorded on each card corresponding to a single page of the book to be printed. Information can be conveniently recorded in this form for use in parts catalogues, repair manuals and other such publications that are updated periodically, since it allows the aperture cards 87 pertaining to those pages that remain unchanged to be reused and permits use of the same cards for pages of different books.

It will be noted that the conventional signature format, shown in FIG. 1, requires that exposure areas 5 through 8 on the top row of the sheet 18 be inverted with respect to the exposure areas 1 through 4 of the bottom row. To permit these two alternative ready positions displaced by 180 degrees, and to facilitate insertion and removal of the cards 87, the projector 20 includes a card holding mechanism 88 supported by a stationary cylindrical outer sleeve 90, that is rotatable about the lens axis "A."

The card holding mechanism 88, shown in FIGS. 6 and 7, retains the card 87 between an aperture plate 92 having a fixed axial position perpendicular to the lens axis "A" and a glass platen 94 that is movable through a small axial distance. An arm 96, pivotable about a pin 98, is also pivotably attached to the center of the platen 94, and a pair of springs 100 urges rotation of the arm in a direction in which it pushes the platen toward the plate 92.

As the holder 88 is rotated from one ready position to the other, it passes through an intermediate position, half-way between, in which the platen 94 is pulled away from the plate 92 against the force of the springs 100. This axial movement of the platen 94 is caused by the arm 96 which carries an integrally formed cam follower 102 projecting at a right angle (parallel to the lens axis "A"). A stationary cam 104 attached to the outside of the sleeve 90 has a generally arcuate edge 106 on which the follower 102 rides, but there is a protruding lobe 108 at the center of the edge. Rotation of the card holder 88 causes the follower 102 to ride up on the lobe 108, forcing the arm 96 to pivot and pull the platen 94 away from the plate 92, thereby releasing the card 87 as it reaches the intermediate position. Upon continued rotation to the opposite ready position or upon return to the previous ready position, the follower 102 moves off the lobe 108, permitting the platen 94 to again press the card 87 firmly against the plate 92. Rotation of the card holder 88 is arrested by an adjustable stop 190 as it reaches either ready position.

A modification of the apparatus 10, shown in FIGS. 9 and 10, differs from the first embodiment only with respect to the projector which is adapted to receive the transparencies in the form of a film strip 110, instead of an aperture card 87, on which the various images are arranged side by side. One frame of the film strip 110, positioned across the lens axis "A," is held firmly during the exposure by a platen 112 lightly biased against the film by two compressed coil springs 114. The film 110 carries a notch 116 corresponding to each image, and the projector 20 includes an indexing mechanism 118 in the form of a pin 120 biased downwardly by a spring 122 against the top edge of the film to engage the notches, thus acting as a detent.

Preferably, the images corresponding to the first horizontal row on the sheet 18 are inverted on the film strip 110 as compared to the images corresponding to the second horizontal row. If, however, all of the images on the strip 110 are to have the same orientation, the film holding mechanism is made rotatable through an angle of 180 degrees, as in the case of the card holding mechanism 88 described above.

While particular forms of the invention have been illustrated and described, it will be apparent that various modifications can be made without departing from the spirit and scope of the invention.

I claim:

1. An apparatus for use in making printing plates comprising:
   a support;
   hanger means for holding a flat sheet of photo-sensitive material;
   track means for attaching said hanger means to said support while permitting horizontal and vertical movement thereof;
   first transport means for moving said hanger means along said track means in a first direction in discrete steps of predetermined length, said first transport means comprising a plurality of fluid-actuated telescoping cylinders connected end to end;
   second transport means for moving said hanger means along said track means in a second direction perpendicular to said first direction, whereby said hanger means and said sheet are capable of assuming a plurality of predetermined exposure positions in response to actuation of said first and second transport means, each of said exposure positions corresponding to a single page of a book in accordance with a signature format;
   control switch means for actuating said cylinders of said first transport means and for actuating said second transport means; and
   projection means for enlarging and projecting a prerecorded image from a transparency onto an exposure area of said sheet comprising a light source, a condenser lens, and an image forming lens.

2. The apparatus of claim 1, wherein said projection means includes card holding means for positioning before said image forming lens an aperture card carrying a micrographic image of a single page to be reproduced on said sheet.

3. The apparatus of claim 2, wherein said card holding means is rotatable to invert said aperture card.

4. The apparatus of claim 1, wherein said projection means comprises:
   card holding means rotatable about an axis for positioning before said image forming lens an aperture card carrying a micrographic image of a single page to be reproduced on said sheet; and
   a pair of stop means for arresting rotation of said card holding means in first and second ready positions, each of said ready positions being inverted with respect to the other.

5. The apparatus of claim 4, wherein said card holding means includes a glass platen for accurately positioning said aperture card.

6. The apparatus of claim 5, wherein said card holding means further comprises cam means for moving said platen against said aperture card when said card holding means assumes either of said ready positions and for moving said platen to release from said card when said card holding means assumes an intermediate position between said ready positions.

7. The apparatus of claim 1, wherein said projection means further comprises indexing means for positioning successive frames of a film strip containing said transparency before said image forming lens.

8. The apparatus of claim 1 further comprising a plurality of pulleys rotatably mounted on said support, a plurality of cables attached to said hanger means and extending over said pulleys, and a counterweight attached to said cables.

9. The apparatus of claim 1, wherein said track means comprises a single horizontal track and a pair of vertical tracks, said horizontal track being movable on said vertical tracks.

10. The apparatus of claim 9, wherein said hanger means is attached to said horizontal track for vertical movement therewith.

11. The apparatus of claim 1 further comprising:
a backing plate; and
a frame adjacent said backing plate for holding an exposure area of said sheet flat against said backing plate in alignment with the axis of said image forming lens and in the focal plane of the projected image.

12. An apparatus for use in making printing plates in signature format comprising:
an open framework forming a support;
a pair of stationary vertical tracks attached to said support;
a horizontal track vertically movable along said vertical tracks;
hanger means for holding a sheet of photo-direct material in a vertical exposure plane for exposure to a series of images, said hanger being hung from said horizontal track and movable therealong;
vertical transport means comprising an air cylinder for moving said horizontal track and said hanger means along said vertical tracks;
a counterweight;
a plurality of cables connecting said counterweight to said horizontal track;
horizontal transport means carried by said horizontal track for moving said hanger means along said horizontal track in a series of discrete steps of predetermined length, said second transport means comprising a plurality of air cylinders connected end to end;
control switch means for actuating said air cylinders of said first and second transport means;
a backing plate extending along a portion of said exposure plane;
a frame adjacent said backing plate for holding a section of said photo-direct sheet flat against said backing plate; and
projecting means for enlarging and projecting a prerecorded micrographic image from a transparency onto an area of said photo-direct sheet, said projecting means comprising a light source, a pair of plano-convex lens elements forming a condensing lens, and an image forming lens, said frame being aligned with the lens axis of said image forming lens.

13. The apparatus of claim 12, wherein said projecting means further comprises:
card holding means rotatable about the lens axis of said image forming lens for positioning an aperture card before said image forming lens in either of two ready positions, each of which is inverted with respect to the other;
an aperture plate disposed across said lens axis;
a platen for holding said aperture card against said aperture plate;
spring means for biasing said platen toward said aperture plate;
an arm pivotably attached to said platen;
a cam follower attached to said arm; and
cam plate means having a fixed position with respect to said support and engaged by said cam follower for causing said arm to move said platen away from said aperture plate, thereby releasing said aperture card when said cam follower moves along said cam means in response to rotation of said card holding means.

14. The apparatus of claim 12 further comprising a plurality of removable spacers for limiting the stroke of of said air cylinders of said horizontal transport means.

15. The apparatus of claim 12 further comprising indexing means for positioning a frame of a film strip containing said transparency before said image forming lens.

* * * * *